United States Patent [19]

Silber et al.

[11] 4,282,542
[45] Aug. 4, 1981

[54] INTERFERENCE-POTENTIAL-COMPENSATED THYRISTOR COMPRISING AT LEAST FOUR ZONES OF DIFFERENT TYPE OF CONDUCTIVITY

[75] Inventors: Dieter Silber, Obertshausen; Marius Füllmann, Neu-Isenburg; Wolfgang Winter, Eschborn, all of Fed. Rep. of Germany

[73] Assignee: Licentia Patent-Verwaltungs-G.m.b.H., Fed. Rep. of Germany

[21] Appl. No.: 81,805

[22] Filed: Dec. 4, 1979

[30] Foreign Application Priority Data

Oct. 9, 1978 [DE] Fed. Rep. of Germany ....... 2843960

[51] Int. Cl.$^3$ .............................................. H01L 29/74
[52] U.S. Cl. ........................................ 357/38; 357/20; 357/30; 357/51; 357/86
[58] Field of Search ................... 357/30, 38, 51, 86, 357/20

[56] References Cited

U.S. PATENT DOCUMENTS 3,995,305  11/1976  Voss ........................................ 357/38
4,122,480  10/1978  Silber et al. ............................ 357/38

FOREIGN PATENT DOCUMENTS 2210386  9/1973  Fed. Rep. of Germany ............. 357/38
2300754  7/1974  Fed. Rep. of Germany ............. 357/38
2407696  8/1975  Fed. Rep. of Germany ............. 357/38

Primary Examiner—Joseph E. Clawson, Jr.
Attorney, Agent, or Firm—McGlew and Tuttle

[57] ABSTRACT

An interference-potential-compensated thyristor comprising, a common emitter zone of one conductivity type, a common main base zone of an opposite conductivity type in contact with said common emitter zone, a common control base of said one conductivity type in contact with said common main base, first and second outer emitter zones of said opposite conductivity type in contact with said common control base, a common metallized electrode layer in contact with said common emitter zone, a first opposite metallized electrode layer in contact with a portion of said common control base and said first outer emitter zone at a junction between said common control base and said first outer emitter zone, and a second opposite metallized electrode layer in contact with a portion of said common control base and said second outer emitter zone at a junction between said common control base and said second outer emitter zone, said first outer emitter zone defining a pilot thyristor part thereabout and said second outer emitter zone defining a sequential thyristor thereabout, a geometry of said first and second outer emitter zones and said first and second opposite metallized electrode layers being chosen so that a capacitance resulting from a forward blocking p-n junction and the surface resistance of said common control base result in a potential which compensates and which approximately corresponds to a maximum interference potential occurring in said common control base beneath said first outer emitter zone, and with an optical or electrical triggering, a potential develops in said common control base adjacent said portion of said first outer emitter zone in contact with said first opposite metallized electrode layer which is substantially lower than the maximum turn-on potential produced in the common control base beneath said first outer emitter zone.

3 Claims, 14 Drawing Figures 4,282,542

INTERFERENCE-POTENTIAL-COMPENSATED THYRISTOR COMPRISING AT LEAST FOUR ZONES OF DIFFERENT TYPE OF CONDUCTIVITY

FIELD AND BACKGROUND OF THE INVENTION

The present invention relates in general to semi-conductor devices and, in particular, to a new and useful interference-potential-compensated thyristor.

There is known an interference-potential-compensated thyristor comprising a plurality of zones of different conductivity and a radially symmetrical pilot thyristor part and adjoined sequential thyristor part, in which the triggering into conduction is effected by means of a first emitter zone of the pilot thyristor part provided with a metallic annular contact. To compensate for the interference potential, a metallic contact is provided in the peripheral region of the control base zone adjacent the first emitter zone and common to both the pilot and the sequential thyristor part, which contact is ohmically connected to the contact of the emitter zone of the pilot thyristor part, so that with interference currents occurring in the control base zone, a potential develops in the peripheral region of the control base zone, which is transferred to the emitter zone of the pilot thyristor part (German OS No. 25 49 563).

In the fabrication of thyristors for a great variety of blocking voltages and holding currents, requirements in this respect are taken into account also in the corresponding various designs of the peripheral region of the thyristor. Accordingly, the interference potential compensation must also be designed differently in each instance.

The problem underlying the invention is to provide an interference-potential compensation which is independent of the most various ranges of blocking voltage and holding current of the thyristors.

SUMMARY OF THE INVENTION

The particular advantage of the invention is that the means for compensation is provided adjacent the pilot thyristor part and forms a self-contained structure which is largely independent of the shape of the sequential thyristor part and eliminates any reactive effect on the compensation. Irrespective of the power type of the thyristor, the same compensating structure can always be integrated therein.

Accordingly, an object of the present invention is to provide an interference potential compensated thyristor comprising, a common emitter zone of one conductivity type, a common main base zone of an opposite conductivity type in contact with said common emitter zone, a common control base of said one conductivity type in contact with said common main base, first and second outer emitter zones of said opposite conductivity type in contact with said common control base, a common metallized electrode layer in contact with said common emitter zone, a first opposite metallized electrode layer in contact with a portion of said common control base and said first outer emitter zone at a junction between said common control base and said first outer emitter zone, and a second opposite metallized electrode layer in contact with a portion of said common control base and said second outer emitter zone at a junction between said common control base and said second outer emitter zone, said first outer emitter zone defining a pilot thyristor part thereabout and said second outer emitter zone defining a sequential thyristor thereabout, a geometry of said first and second outer emitter zones and said first and second opposite metallized electrode layers being chosen so that a capacitance resulting from a forward blocking p-n junction and the surface resistance of said common control base result in a potential which compensates and which approximately corresponds to a maximum interference potential occurring in said common control base beneath said first outer emitter zone, and with an optical or electrical triggering, a potential develops in said common control base adjacent said portion of said first outer emitter zone in contact with said first opposite metallized electrode layer which is substantially lower than the maximum turn-on potential produced in the common control base beneath said first outer emitter zone.

A further object of the present invention is to provide a thyristor which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the following, the invention is explained in more detail with reference to embodiments diagrammatically illustrated in the drawings in which:

FIG. 6b is a potential diagram of the thyristor of FIG. 6a;

FIG. 7b is a potential diagram of the thyristor of FIG. 7a.

DESCRIPTION OF THE PREFERRED EMBODIMENTS

Figure 1A:
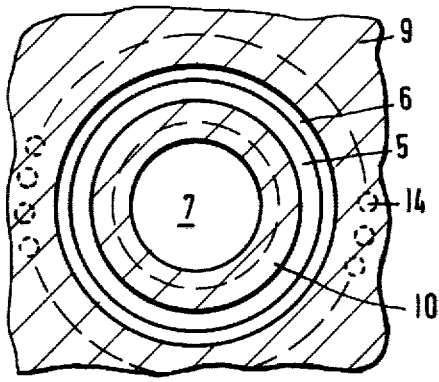
FIGS. 1a and 1c are partial plan and sectional views, respectively, of a prior art optically triggerable thyristor without interference-potential compensation.
Figure 1C:
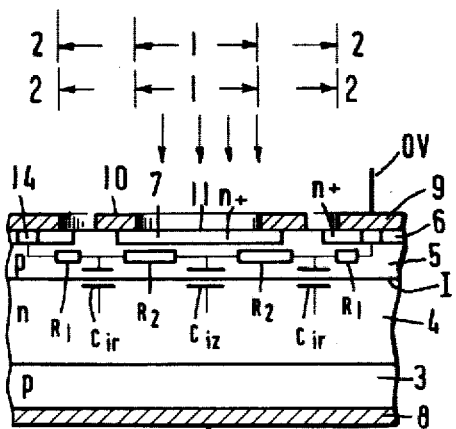

The optically triggerable thyristor shown in FIGS. 1a and 1c comprises a pilot thyristor region 1 and a sequential thyristor region 2. The thyristor has a common P-type emitter zone 3 which is coated with an anode-terminal metallizing layer 8, a following common N-type main base zone 4, an adjoining common P-type control base zone 5, an adjoining N+ type emitter zone 6 of the sequential thyristor region 2, and an N+-type emitter zone 7 of the pilot thyristor region 1. The N+-type emitter zone 6 of sequential thyristor region 2 is provided with a cathode-terminal metallized layer 9, while the N+-type emitter zone 7 and the P-type control base zone 5 are connected to each other through an annular metallized layer 10.

The optical radiation triggering the thyristor is indicated by arrows and is incident on the surface 11 of N+-type emitter zone 7 of pilot thyristor region 1. Emitter shortings of the N+-type emitter zone 6 of sequential thyristor region 2 are indicated at 14.

Figure 1B:
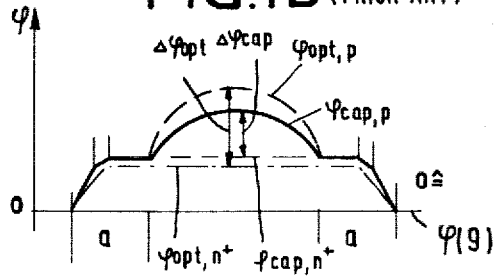
FIG. 1b is a respective potential diagram thereof.

To better understand the operation of the thyristor, surface resistances $R_1$, $R_2$ are indicated in the P-type control base zone 5, and a PN-junction capacitance $C_{iz}$ resulting from the forward-blocking PN-junction I is indicated in the region of incidence 11, and PN-junction capacitances $C_{ir}$ between the regions 1, 2. Since the structure is radially symmetrical, in fact, a plurality of circularly distributed resistances $R_1$, $R_2$ is to be considered. In the following, the operation of the thyristor is explained in more detail with reference to FIGS. 1a, 1c and the diagram of FIG. 1b. It is assumed that the cathode-metallized layer 9 is at the zero potential. The dashed curve phi$_{opt,p}$ shows the potential appearing in the P-type control base zone 5 upon an optical irradiation, the solid-line curve phi$_{cap,p}$ shows the potential appearing in the P-type control base zone upon the occurrence of capacitive currents. Since N+-type emitter zone 7 is connected to P-type control base zone 5 through the annular metallized layer 10, its potential is correspondingly raised upon an optical irradiation, as indicated by the dash dotted line phi$_{opt,n+}$. The same goes for N+-type emitter zone 7 if capacitively produced currents occur, as indicated by the dashed line phi$_{cap,n+}$.

The optical switching into conduction is thus initiated by the potential difference delta phi$_{opt}$ and the interference turn-on is caused by the potential difference delta phi$_{cap}$, which both potential differences appear between the N+-type emitter zone 7 and the subjacent region of the P-type control base zone 5.

The magnitude of potential differences delta phi$_{opt}$ and delta phi$_{cap}$ depends on the surface resistance $R_2$. The slope of the potential curves phi$_{opt,p}$ and phi$_{cap,p}$ results from surface resistances $R_1$, $R_2$ and the photocurrent, on the one hand, and from surface resistances $R_1$, $R_2$ and the capacitive currents from capacitances $C_{iz}$, $C_{ir}$, on the other hand, with an initial, relatively steep increase in P-type control base zone 5 from the zero potential in the region a, which is followed by a less steep potential rise between the N+-type emitter zone 6 and the N+-type emitter zone 7 where the P-type control base zone 5 is partly covered by metallized layer 10. The following potential increase in P-type control base zone 5 beneath N+-type emitter zone 7 is steep and approximately parabolic.

Thus both with an optical irradiation and with the occurrence of capacitively produced currents (di/dt load), the potential of N+-type emitter zone 7 increases, and the interference-potential difference delta phi$_{cap}$ caused by occurring capacitive currents results in an unintentional turning on of the thyristor.

Figure 2A:
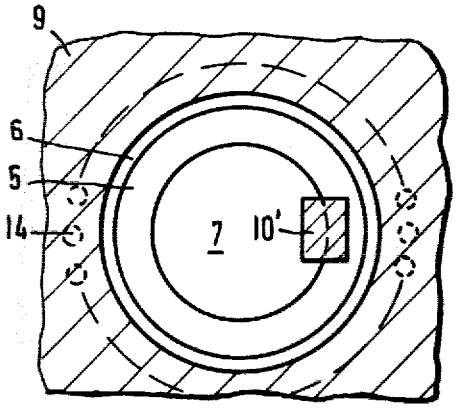
FIGS. 2a, 2c and 2b are figures similar to FIG. 1a, 1c and 1b of a variant of the thyristor of FIG. 1.

Instead of the annular metallized layer 10, a metallized layer 10' shorting only a portion of N+-type emitter zone 7 and of P-type control base zone 5 may be provided, as shown in FIG. 2a. The occurring interference potential phi$_{cap,p}$ is then transferred to N+-type emitter zone 7 through the asymmetrically disposed metallized layer 10'. Surface resistances and PN-junction capacitances remain unchanged as according to FIG. 1a and the function and susceptibility to capacitively produced currents is unchanged accordingly, as may be learned from the diagram of FIG. 2b.

In the design of both FIG. 1a and FIG. 2a, the optical and the capacitive switching sensitivities depend on the surface resistance $R_2$ and they are linked to each other through this resistance.

Figure 3A:
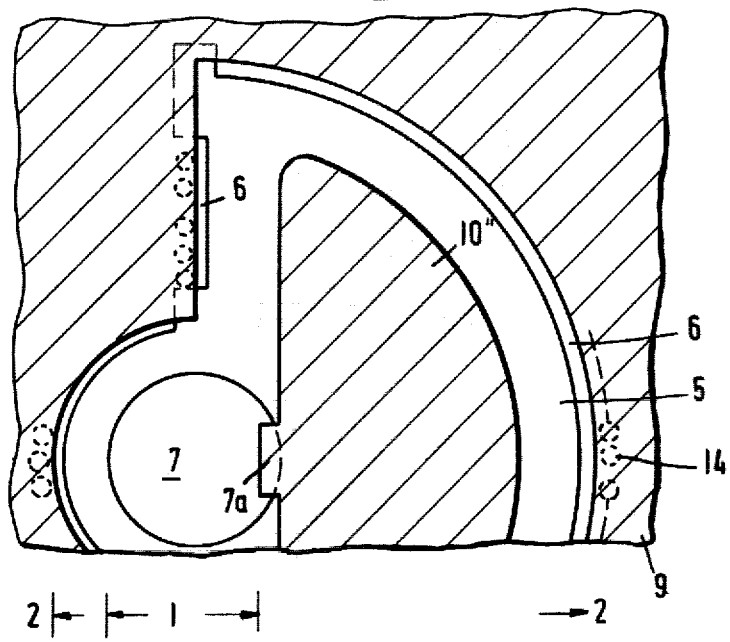
FIGS. 3a and 3c are partial plan and sectional views respectively of an inventive, interference-potential-compensated, optically triggerable thyristor with the respective potential diagram
Figure 3C:
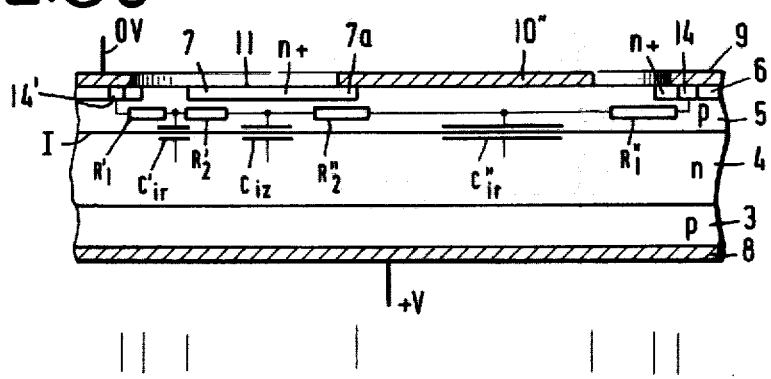

The interference-potential-compensated thyristor of FIG. 3a also uses a asymmetrically disposed metallized layer 10" by which only a portion 7a of N+-type emitter zone 7 is shorted to P-type control base zone 5.

To obtain an interference-potential-compensation directly effective through emitter shorting 10", the structure of P-type control base zone 5 is designed so as to obtain the surface resistances $R_1'$, $R_1''$, $R_2'$, $R_2''$, and the capacitance $C_{iz}$ in the radiation incidence range, as well as capacitances $C_{ir}'$, $C_{ir}''$.

Figure 2C:
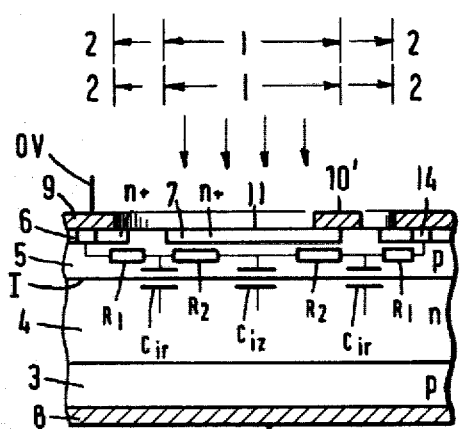
Figure 2B:
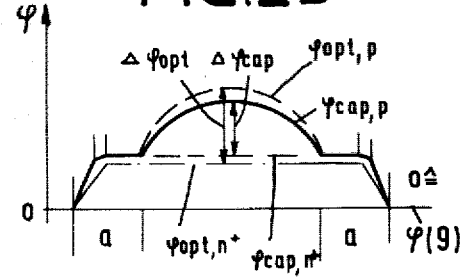

The surface resistances $R_2'$, $R_2''$ of substantially equal magnitude are, as before, radially symmetrically distributed in P-type control base zone 5, beneath N+-type emitter zone 7, as in the thyristors according to FIGS. 1 and 2. Surface resistance $R_1''$ is provided approximately between the periphery of emitter shorting 10" and emitter shorting 14 of the sequential emitter zone 6. In the now relatively extensive region of P-type control base zone 5 covered by emitter shorting 10", the surface resistance is zero.

A parallel connection is established between surface resistance $R_2'$ and the series-connected surface resistances $R_2''$, $R_1''$. These resistances define the total resistance determining the optical switching sensitivity:

$$\frac{R_2^1(R_2'' + R_1^1)}{R_2^1 + (R_2'' + R_1')}$$

If an optical radiation reaches area 11, an approximately circularly symmetrical potential phi$_{opt,p}$ develops in P-type control base zone 5 due to the photocurrent and the surface resistances $R_2'$, $R_2''$, and a slightly increased potential phi$_{opt,n+}$ develops in the N+-type emitter zone 7, as in the designs of FIGS. 1 and 2.

Figure 3B:
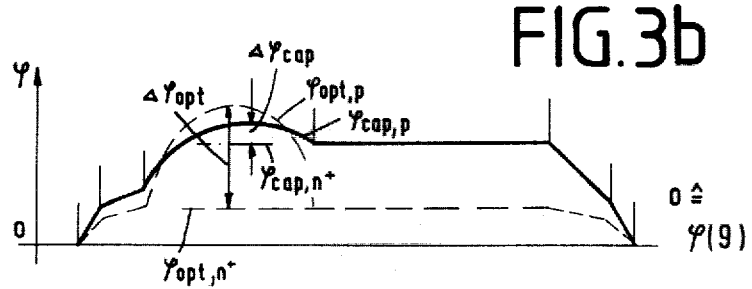
FIG. 3b is a potential diagram thereof.

If capacitively produced currents occur in P-type control base zone 5, a potential phi$_{cap,p}$ develops in P-type control base zone 5 due to the asymmetrical configuration of this zone and to the capacitive currents caused by capacitances $C_{iz}$, $C_{ir'}$ and passing through the resistances as also illustrated in FIG. 3b. The potential increases from emitter shorting 14' of emitter zone 6, as in the case of the thyristors shown in FIGS. 1 and 2, up to a peak value, however, remains then substantially constant at a slightly lower value within the area of emitter shorting 10", and drops only outside of this area, toward emitter shorting 14 in the region of surface resistance $R_1''$. At the same time, N+-type emitter zone 7 is raised to a potential $phi_{cap,n+}$ so that a potential difference delta $phi_{cap}$ establishes which is not sufficient for turning on the thyristor.

The potential $phi_{cap,p}$ is obtained by making the product $C_{ir}'' \times R_1''$ approximately equal to the product $C_{iz} \times R_2'$.

The dimensioning and distribution of surface resistances $R_1''$ also affects the turn-on properties of the sequential thyristor region 2. To obtain a satisfactory sequential turn-on, an as low as possible surface resistance $R_1''$ and a correspondly high capacitance $C_{ir}''$ are provided. Both is obtained by the mushroom-like shaped emitter shorting 10'' covering N+-type emitter zone 7 only in the area 7a and P-type control base zone 5 only unilaterally. This results in an asymmetrical emitter shorting 10'' connecting N+-type emitter zone 7 to the adjacent radial portion of P-type control base zone 5 only unilaterally and forming, in connection with the P-type control base zone 5 it covers, a capacitance $C_{ir}''$ which is so proportioned to the surface resistance $R_1''$ of P-type control base zone 5 extending between the periphery of emitter shorting 10'' and emitter shorting 14 of N+-type emitter zone 6 of sequential thyristor region 2 that upon the occurrence of capacitively produced currents in P-type control base zone 5, an increased potential develops which is effective in the region of emitter shorting 10'' and approximately corresponds to the turn-on potential, so that the adjacent N+-type emitter zone 7 is raised to the potential $phi_{cap,n+}$ which results in a negligibly small potential difference delta $phi_{cap}$, as shown in FIG. 3b.

As in the thyristors of FIGS. 1 and 2, optical irradiation results in a relatively small potential increase $phi_{opt,n+}$ in N+-type emitter zone 7, while the approximately circular potential increase $phi_{opt,p}$ in P-type control base zone 5 is high, so that a desired large potential difference delta $phi_{opt}$ is obtained. At the occurrence of capacitively produced currents, however, the asymmetric potential increase $phi_{cap,n+}$ in N+-type emitter zone 7 is high, so that a desired small potential difference delta $phi_{cap}$ is obtained. But the potential increase $phi_{opt,n+}$ produced in N+-type emitter zone 7 by the optical irradiation remains small because no photocurrent flows in the entire region of P-type control base zone 5 covered by emitter shorting 10''.

Figure 4A:
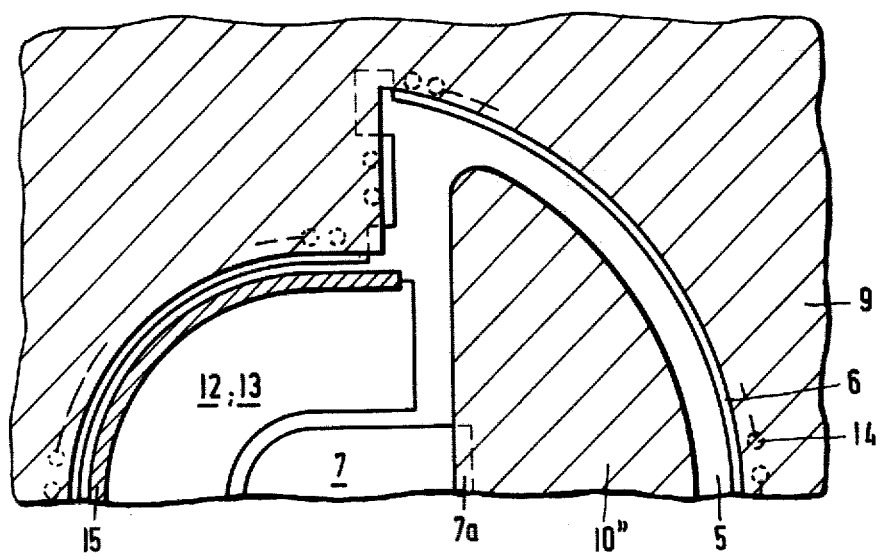
FIGS. 4a and 4b are partial plan and sectional views, respectively, of another embodiment of an inventive, interference-potential-compensated-optically triggerable thyristor in which a potential limitation is provided.
Figure 4B:
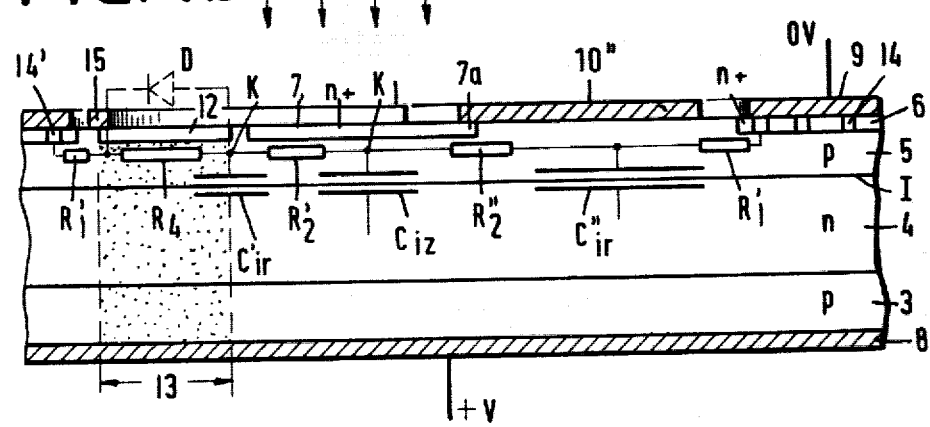

The thyristor shown in FIGS. 4a and 4b are equipped with a potential limitation.

To this end the region 13 having an outer N+-type zone 12 and a contacting strip 15 are provided opposite to the radially asymmetrical portion of P-type control base zone 5 covered by emitter shorting 10''. To obtain a diode effect, a recombination center diffusion, for example, is made in region 13. Therefore, the region is no longer effective as a thyristor. Instead of the N+-type zone 12, a metal-semiconductor diode may be formed in region 13. For this purpose, the metallizing 15 is extended to the entire area 13 and shorted to metallizing 9. The doping concentration of control base zone 5 in region 13 and the manner of metallizing 15 must meet the requirements on a metal-semiconductor diode.

The irradiation area 11 with the PN-junction capacitance $C_{iz}$, the PN-junction capacitances $C_{ir}'$, $C_{ir}''$, and the surface resistances $R_2'$, $R_2''$ of the irradiation region as well as the surface resistance $R_1''$ in P-type control base zone 5 correspond to those in the thyristor according to FIG. 3a.

To limit the potential in region 13, a surface resistance $R_4$ is provided in P-type control base zone 5 beneath N+-type zone 12, which is followed by the surface resistance $R_1'$ through which the current flows to the emitter shorting 14' of emitter zone 6 of the sequential thyristor region 2.

In the region 13 of P-type control base zone 5, the N+-type zone 12 forms a potential limiting diode D, as shown in dashed lines.

As soon as at the point K, the potential exceeds about 0.7 volts due to occurring capacitively produced currents, the current no longer flows through surface resistance $R_4$ but it flows into N+-type zone 12 offering a negligible resistance and further to contacting 15 and through the very small surface resistance $R_1'$ to emitter shorting 14'.

Thereby, the potential at K is limited for most various capacitive currents. This potential limitation is effective only in the region 13 partly surrounding N+-type emitter zone 7.

If the capacitive currents discharged by the capacitances do not attain the limit predetermined by diode D, the current from central capacitance $C_{iz}$ is split at $K_1$, to the effect that the divided currents flow radially in all directions. The currents from capacitance $C_{ir}'$ flow radially in the direction of emitter shortings 14' and the currents coming from capacitance $C_{ir}''$ flow radially in the direction of emitter shortings 14 of N+-type emitter zone 6 of sequential thyristor region 2.

Figure 5A:
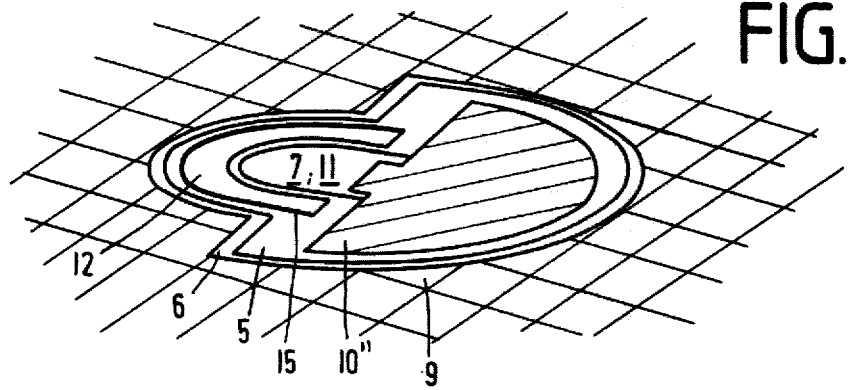
FIG. 5a is a top perspective view which shows the surface of this thyristor and FIGS. 5b and 5c are two potential diagrams relating thereto.

With capacitances $C_{ir}'$, $C_{ir}''$ about equal to each other and surface resistances $R_1''$, $R_2''$ about corresponding to surface resistances $R_2'$, $R_4$, point K1 forms a current parting point or split point (see FIG. 5a at $\phi_{opt,p}$).

In case of inadmissably high capacitively produced currents, surface resistance $R_4$ is practically shorted by the diode effect of N+-type zone 12, so that a larger current flows in the direction of emitter shortings 14' than in the direction of emitter shortings 14. Substantially no current or only a very small capacitive current will flow from capacitance $C_{iz}$ through surface resistance $R_2''$. Accordingly, current peak and the potential maximum will be displaced in the direction of emitter shorting 10''.

Since surface resistance $R_4$ is chosen greater than or equal to $R_2'$, while in the thyristor of FIG. 3a only a relatively small surface resistance $R_1'$ is provided in the same region of P-type control base zone 5, an increased total surface resistance combination $R_1'$, $R_2'$, $R_2''$, $R_1'''$ is now obtained, so that the necessary turn-on potential for the pilot thyristor region is obtained with smaller photocurrents and the sensitivity to light is increased.

The potential limiting N+-type zone 12 surrounds about three fourths of the N+-type emitter zone 7 which is extended relative to the design of FIG. 3a and serves the turn-on purpose whereby the effectiveness of the potential limitation and the photosensitivity are increased.

FIG. 5a again is a partial view of the surface of the thyristor of FIG. 4 showing N+-type emitter zone 6 of the sequential thyristor region and its contacting nine, P-type control base zone 5 with its emitter shorting 10'' whose projecting extension provides contact with the portion 7a of N+-type emitter zone 7 of the pilot thyristor region, and N+-type zone 12 which, along the P-type control base zone 5, is effective as a diode and is connected to P-type control base zone 5 also ohmically, through contacting strip 15.

Figure 5B:
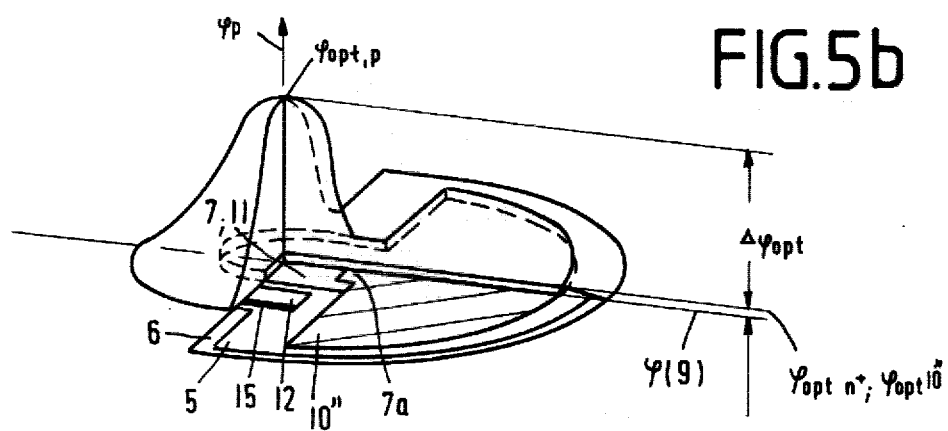

The qualitative potential diagram of FIG. 5b shows the potential configurations developing at a turn-on.

Upon an optical irradiation, a maximum potential $phi_{opt,p}$ develops in the region beneath N+-type emitter zone 7 of P-type control base zone 5. The foot level phi of the potential is the metallized layer 9 of N+-type emitter zone 6. As further shown, the region beneath emitter shorting 10'' of P-type control base zone 5 is slightly raised to a potential $phi_{opt\ 10''}$, and so is N+-type emitter zone 7 which is connected to this region of P-type control base zone 5 in the area 7a through emitter shorting 10'''. Consequently, $phi_{opt,n+}$ equals $phi_{opt\ 10''}$.

The potential difference delta $phi_{opt}$ between the potentials $phi_{opt,n+}$ and $phi_{opt,p}$ is the turn-on potential.

Figure 5C:
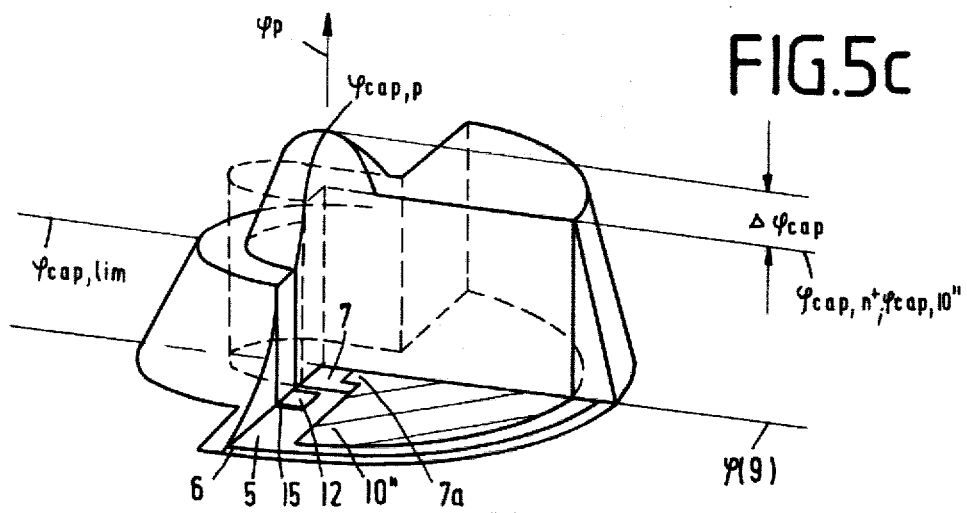

FIG. 5c shows the potentials developing at the occurrence of capacitively produced currents.

A limited potential $phi_{cap,\ lim}$ in accordance with the U-shaped configuration develops in the N+-type zone 12 having a non-linear characteristic. The potential $phi_{cap,10''}$ capacitively developed in the region of emitter shorting 10'' of P-type control base zone 5 is now quite substantially increased and applied, through emitter shorting 10''', to N+-type emitter zone 7 which, consequently, has the potential $phi_{cap,n+}$.

N+-type emitter zone 7 is thus raised to such a potential that the potential difference delta $phi_{cap}$ between the maximum interference potential $phi_{cap,p}$ of the region beneath N+-type emitter zone 7 of P-type control base zone 5 and the potential $phi_{cap,n+}$ of N+-type emitter zone 7 is not sufficient to effect to switching caused by interference.

If a still higher interference potential $phi_{cap,p}$ develops than shown, the compensation potential $phi_{cap,10''}$ and, therefore, the potential $phi_{cap,n+}$, are also raised, but the limiting potential $phi_{cap,lim}$ is not increased. The result is that upon an increase of the interference potential $phi_{cap,p}$ due to stronger interference currents, the maximum of this interference potential rises in a far smaller proportion than without this limitation, so that the potential difference delta $phi_{cap}$ continues to remain sufficiently small to prevent interference switching.

Figure 6A:
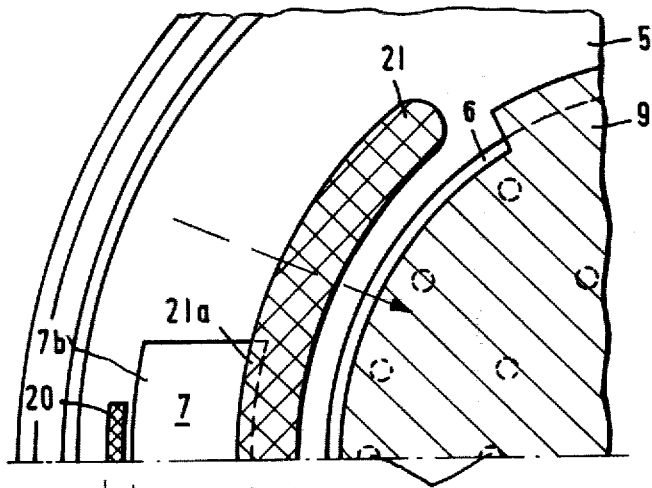
FIGS. 6a and 6c are partial plan and sectional views, respectively, of another design of a thyristor without interference-potential compensation, which is triggerable both optically and electrically.
Figure 6C:
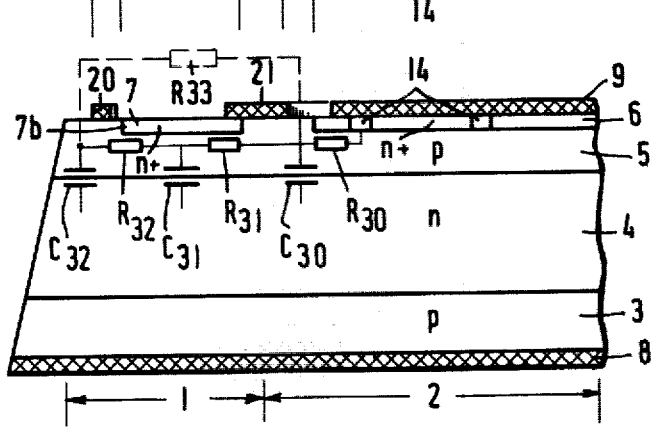

FIG. 6a is a partial view of a thyristor which is not inteference-potential compensated and can be triggered into conduction optically or electrically in its peripheral region.

The pilot thyristor region and the sequential thyristor region are designated 1 and 2, respectively.

The electrical triggering is effected through a contact 20 located near the N+-type emitter zone, to which a positive control current is supplied. A relatively long contact strip 21 connects the N+-type emitter zone 7 to P-type control base zone 5 and forms the emitter shorting in a portion 21a.

To better understand the operation under dv/dt load, PN-junction capacitances $C_{30}$ and $C_{32}$ and surface resistances $R_{30}$ to $R_{32}$ are indicated. Surface resistance $R_{30}$ terminates at emitter shorting 14 of N+-type emitter zone 6 of sequential thyristor region 2. This resistance must be provided sufficiently small, to keep low the interference potential appearing thereacross and caused by the capacitive currents of capacitances $C_{31}$, $C_{32}$, and thus to prevent an unintentional triggering of sequential thyristor region 2.

As indicated by the dashed arrow, a capactive current also flows from the peripheral zone of pilot thyristor region 1 to the cathode matallizing 9, without flowing beneath N+-type emitter zone 7 and through P-type control base zone. This current path is indicated by the dotted-line resistance $R_{33}$ which is connected to capacitances $C_{32}$ and $C_{30}$. This current again passes through resistance $R_{30}$ to emitter shorting 14.

If capacitively produced interference currents appear in capacitances $C_{30}$ to $C_{32}$, they are drained through resistances $R_{30}$ through $R_{33}$ in the direction of emitter shorting 14. The interference potential rise thereby developed in the peripheral region ($C_{32}$) of P-type control base zone 5 causes an interference turn-on.

This interference potential can be lowered by reducing capacitance $C_{32}$ through reducing pilot thyristor region 1, and by reducing capacitance $C_{31}$; a reduced surface of capacitor 31 also reduces resistance $R_{31}$. Resistances $R_{31}$, $R_{32}$ are critical for the desired turn-on. If the sensitivity to interferential switching on is reduced by reducing resistances $R_{31}$, $R_{32}$, the desired turn-on sensitivity is also reduced and a stronger control current is needed.

Figure 6B:
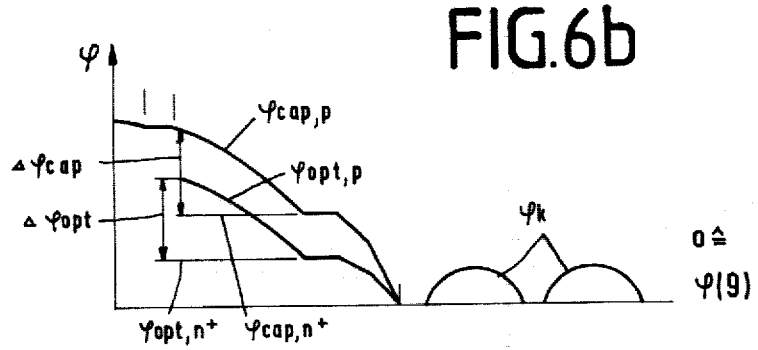

As may be learned from the potential diagram of FIG. 6b, with a thyristor according to FIG. 6a having no interference potential compensation, the cathode contact layer 9 of sequential thyristor region 2 is at zero potential. In control base zone 5, potential elevations $phi_k$ appear between emitter shortings 14 at a capacitive load, which may be kept low by a sufficiently dense arrangement of the emitter shorts, so that sequential thyristor region 2 is prevented fom unintentional switching on.

From the emitter shorting 14 proximate the edge of contact layer 9 up to the edge of N+-type emitter zone 6, the interference potential $phi_{cap,p}$ due to a capacitive load increases relatively steeply in control base zone 5, this increase is reduced before reaching the edge of emitter shorting 21 of pilot thyristor region 1, the potential is constant in the area of shorting 21 and is transferred to N+-type emitter zone 7.

The capacitively produced potential $phi_{cap,p}$ in control base zone 5 beneath N+-type emitter zone 7 further increases approximately parabolically and attains its maximum at the edge area 7b in P-type control base zone 5, where, consequently, also the potential difference delta $phi_{cap}$ leading to an unintentional switchin on occurs. In the area of electrode 20 which is provided for electrical triggering, potential $phi_{cap,p}$ remains constant to slightly increase only toward the periphery of the thyristor.

Upon an optical triggering, the maximum optical potential $phi_{opt,p}$ also appears in P-type control base zone 5 beneath the edge area 7b of N+-type emitter zone 7, since only a small portion of the photocurrent flows across surface resistance $R_{32}$ while the major portion is drained through surface resistance $R_{31}$.

With an optical triggering again, the potential $phi_{opt,n+}$ in N+-type emitter zone 7 is slightly raised, but the potential difference delta $phi_{opt}$ is sufficiently high for a turn-on.

With an electrical triggering through electrode 20, the potential varies in a manner substantially similar to that of an optical triggering, wherefore the variation is not shown separately. The potential maximum in P-type control base zone 5 again appears beneath edge 7b of N+-type emitter zone 7, to drop linearly toward emitter shorting 21.

Figure 7A:
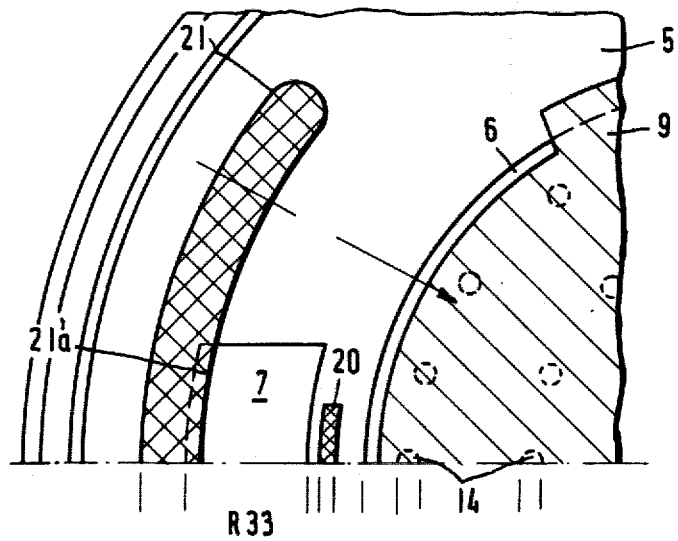
FIGS. 7a and 7c show a design similar to that of FIG. 6, but with an interference-potential compensation.
Figure 7C:
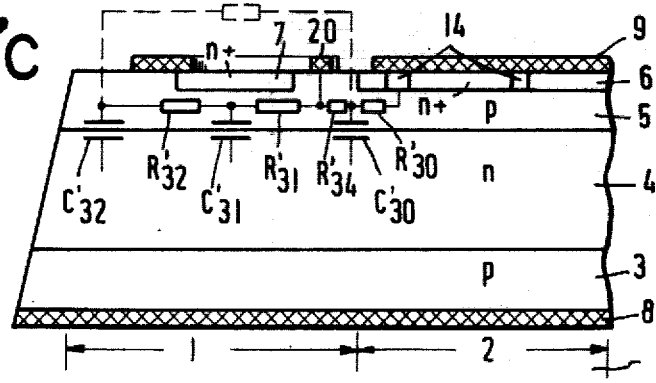

In the interference-potential-compensated thyristor of FIG. 7a, the positions of control contact 20 and emitter shorting 21' at N+-type emitter zone 7 of auxiliary thyristor region 1 are interchanged, as compared with the design of FIG. 6a.

The PN junction capacitances are designated $C_{30}'$ to $C_{32}'$ and the surface resistances $R_{30}'$ to $R_{33}'$, and a further resistance $R_{34}'$ is indicated which is connected in series to resistances $R_{30}'$ to $R_{32}'$. Capacitance $C_{32}'$ is formed by the region beneath emitter shoring 21' of P-type control base zone 5.

Capacitances $C_{31}'$, $C_{32}'$ are so dimensionsed that the interference potential appearing at capacitance $C_{32}'$ is substantially equal to the maximum interference potential occurring at capacitance $C_{31}'$, thus occurring in P-type control base zone 5 beneath N+-type emitter zone 7.

Now, in case of an interference, the potential of N+-type emitter zone 7 is raised, by means of portion 21'a of emitter shorting 21', to a potential given by the capacitive current of marginal capacitance $C_{32}'$ and, thereby, produced at resistance $R_{32}'$.

This results in a potential difference between the interference potential occurring beneath N+-type emitter zone 7 in P-type control base zone 5 and the potential applied to N+-type emitter zone 7, which is so small that no unintentional turn-on can occur.

The intentional triggering into conduction is initiated either by optical irradiation in N+-type emitter zone 7 or by applying a turn-on power to trigger contact 20.

Upon supplying control current through contact 20, a portion of the current is drained through resistances $R_{34}'$, $R_{30}'$ and another portion through resistances $R_{31}'$, to $R_{33}'$ and again through $R_{30}'$.

The electrical switching on is triggered through the last-named current path.

Since emitter shorting 21' is now provided in the marginal region of the thyristor, the optically produced switching current is drained through resistances $R_{31}'$, $R_{32}'$. To obtain the same sensitivity to triggering as in the thyristor according to FIG. 6a, correspondingly higher surface resistances $R_{31}'$, $R_{32}'$ are provided.

As mentioned above, a small surface resistance $R_{33}'$ is provided and the capacitive current of junction capacitance $C_{32}'$ is substantially drained through this resistance and the potential increase thereby produced at this resistance approximately corresponds to the potential increase produced at the series-connected resistances $R_{31}'$, $R_{34}'$ due to the current of capacitance $C_{31}'$ substantially flowing only through these resistances. Consequently, practically no capacitive current flows through resistance $R_{32}'$ at a capacitive load.

Resistance $R_{33}'$ is dimensioned by providing a definite length of the emitter shorting strip 21'.

Figure 7B:
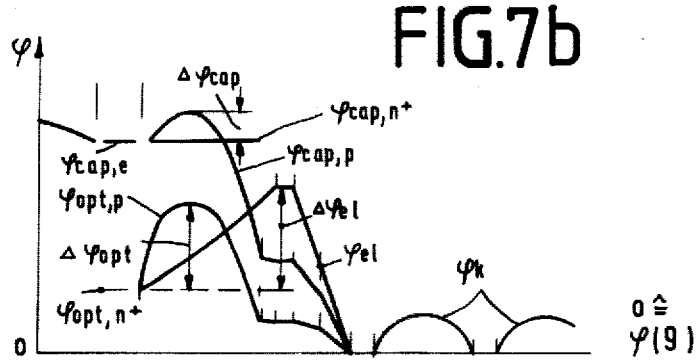

As may be learned from the potential diagram of FIG 7b, the maxima of the capacitively produced interference potential $phi_{cap,p}$ and the optical trigger potential $phi_{opt,p}$ appear now within the P-type control base zone 5 about in the center of N+-type emitter zone 7.

The variation of the capacitively produced potential $phi_{cap,p}$ in the right hand part of the diagram resembles to that shown in potential diagram of FIG. 6b. The potential $phi_{cap,p}$ again increases steeply up to the edge of N+-type emitter zone 6, then less steeply to electrode 20, remains constant in the area of this electrode, to rise then steeply again. The increase of potential $phi_{cap,p}$ relative to that of FIG. 6a is caused by the higher surface resistance $R_{31}'$. The emitter shorting 21' has a strongly raised potential $phi_{cap,e}$ approximately corresponding to the maximum of potential $phi_{cap,p}$. Potential $phi_{cap,e}$ is transferred through emitter shorting 21' to N+-type emitter zone 7, so that a potential difference delta $phi_{cap}$ is produced which is not sufficient for turning on the thyristor.

With an optical triggering, the photocurrent is drained in one direction through resistances $R_{31}'$, $R_{34}'$, $R_{30}'$ and in the other direction through resistances $R_{32}'$, $R_{33}'$, $R_{30}'$. This also causes an only relatively small potential increase of emitter shorting 21' and a correspondingly low potential $phi_{opt,n+}$ of N+-type emitter zone 7. The potential $phi_{opt,p}$ developed in P-type control base zone 5, on the contrary, is so high that a potential difference delta $phi_{opt}$ is produced causing the thyristor to be turned on.

An electrical triggering through electrode 20 leads to a control base potential $phi_{el}$ having its maximum beneath the right hand edge of N+-type emitter zone 7. The thyristor is turned on by the produced potential difference delta $phi_{el}$.

The magnitude of the surface resistances of P-type control base zone 5 results from their geometry, i.e. the provided thickness of this zone and impurities diffusion. The thickness of zone 5 may be varied by well known methods of masked etching in accordance with the required surface resistances. In addition, or alternatively, even more partly masked control base diffusions may be provided with a correspondingly varying diffusion profile.

While specific embodiments of the invention have been shown and described in detail to illustrate the application of the principles of the invention, it will be understood that the invention may be embodied otherwise without departing from such principles.

We claim:

1. An interference potential compensated thyristor comprising:

a semi-conductor body having; a common emitter zone of one conductivity type, a common main base zone of an opposite conductivity type in contact with said common emitter zone, a common control base zone of said one conductivity type in contact with said common main base zone defining one surface of said semiconductor body, at least first and second outer emitter zones of said opposite conductivity type in contact with said common control base, said outer emitter zones formed at said one surface of said semiconductor body with said common control base zone extending to said one surface between and around said outer emitter zones; a common metallized electrode layer in ohmic contact with said common emitter zone, a first opposite metallized electrode layer in ohmic contact with an edge portion of said first outer emitter zone and a portion of said common control base zone at said semi-conductor body surface and over a junction between said common control base zone and said first outer emitter zone to ohmically connect said edge portion of said outer emitter zone and said common control base zone, a second opposite metallized electrode layer in contact with said second outer emitter zone, said first outer emitter zone forming part of a pilot thyristor part and said second outer emitter zone forming a part of a sequential thyristor part; wherein a substantially maximum value for the interference potential in said common control base zone adjacent said first outer emitter zone is applied to said edge portion of said first outer emitter zone in contact with said first opposite metallized electrode layer; only said edge portion of said first outer emitter zone being ohmically connected to said common control base zone; the size of said portion of said common control base zone in contact with said first opposite metallized electrode layer being dimensioned so that a resistance between said first opposite metallized electrode layer and said sequential thyristor part being smaller than a resistance between said pilot thyristor part and said sequential thyristor part opposing a flow of triggering control current between said pilot thyristor part and sequential thyristor part.

2. A thyristor according to claim 1, wherein said edge portion of said first outer emitter zone in contact with said first opposite electrode layer is small with respect to said portion of said common control base in contact with said first opposite electrode layer, said first opposite electrode layer being asymmetrically connected to said first outer emitter zone and said common control base zone.

3. A thyristor according to claim 2, wherein the product $C''_{ir} \times R''_1$ is chosen to be approximately equal to the product $C_{iz} \times R'_2$ wherein $C''_{ir}$ equals a capacitance of a PN junction between said control base zone and said main base zone under said first opposite electrode layer;

$R''_1$ is the resistance in said control base zone between said sequential thyristor and said portion of said control base zone under said first opposite electrode layer;

$C_{iz}$ is the capacitance of a PN junction between said control base zone and said main base zone under said first outer emitter zone; and $R'_2$ is the resistance in said control base zone between said pilot thyristor and said sequential thyristor on a side of said first outer emitter zone opposite said first opposite electrode layer.

* * * * *